United States Patent [19]

Nador et al.

[11] 4,024,472
[45] May 17, 1977

[54] METER CONSTRUCTION

[75] Inventors: Julius Nador, Plainfield; David B. Pearson, Raritan, both of N.J.

[73] Assignee: Weston Instruments, Inc., Newark, N.J.

[22] Filed: Aug. 2, 1974

[21] Appl. No.: 494,320

[52] U.S. Cl. .................. 324/151 R; 324/154 R
[51] Int. Cl.² .................. G01R 1/16; G01R 1/00
[58] Field of Search .......... 324/151 R, 151 A, 156, 324/106, 154 R

[56] References Cited

UNITED STATES PATENTS

| | | | |
|---|---|---|---|
| 2,970,267 | 1/1961 | Pfeffer | 324/154 R |
| 3,333,193 | 7/1967 | Thomander | 324/154 R |
| 3,590,375 | 6/1971 | Sills | 324/154 R |
| 3,764,909 | 10/1973 | Pearson et al. | 324/156 |
| 3,854,090 | 12/1974 | Tashiro et al. | 324/106 |

*Primary Examiner*—Rudolph V. Rolinec
*Assistant Examiner*—Ernest F. Karlsen
*Attorney, Agent, or Firm*—William R. Sherman; Kevin McMahon; Walter Kruger

[57] ABSTRACT

A moving coil instrument with a unique base of non-magnetic sheet metal construction so arranged that sides of the base can flex to receive and clampingly retain a magnetic circuit, without causing movement of end portions of the base which support the moving coil for pivotal movement. Projections of a casing cooperate with circular mounting ears on the sides of the base to exert an inward force to assist the clamping action of the sides to securely hold the magnetic circuit against movement. A unique unitary sheet metal balance cross and a terminal plate assembly provide for connecting inner ends of taut bands which support the coil for movement. Cooperating tabs and slots on the coil, balance cross, and terminal assembly provide for securing the terminal plate and balance cross at opposite ends of the coil in predetermined locations with respect to the coil. A unique stop arrangement including tab means integral with the balance cross, and a hub cooperate to limit transverse displacement of the coil as a result of shock and vibration, to prevent damage to the delicate taut bands which support the coil for pivotal movement. The overall arrangement provides for rapid assembly without danger of substantial inaccuracy of the assembled instrument as a result of accumulation of tolerances.

24 Claims, 9 Drawing Figures

Fig 6

METER CONSTRUCTION

This invention relates to an electrical indicating device of moving coil type which is particularly adapted to be easily and quickly assembled, and to be manufactured at low cost.

More specifically, the invention relates to a moving coil type of instrument, such as an electrical meter which is so constructed and arranged that the meter can be quickly and accurately assembled, with a minimum of parts, and can be produced on a mass production basis.

The meter of this invention is an improvement of the meter shown and described in U.S. Pat. No. 3,764,909, issued Oct. 9, 1973, inventor David B. Pearson, and assigned to the same assignee as this invention.

BACKGROUND OF THE INVENTION

In most instances, in the past, because of the number of steps required to assemble and the number of parts required for constructing measuring instruments of the moving coil type such as D'Arsonval meters, such meters have not been as capable of mass production manufacture as the meter of the present invention. Typically, in the past, such meters have required precision assembly, with the attendent use of expensive jigs and fixtures, and have frequently required extensive calibration after assembly. In most instances, the assembly and calibration included selecting a scale which matched the characteristics of the meter, after these characteristics were observed and determined by testing each meter.

Frequently, the need of such tedious calibration and precise manufacture and assembly tolerances, was the result of a meter arrangement where tolerances accumulated so the assembled meters in some instances were quite accurate, and in other instances were exceedingly inaccurate. Even though the usual accuracy of a relatively low cost meter is plus or minus 2% of fully scale deflection, it was frequently impossible to maintain accuracy at a 4% or 5% level. Correspondingly, rejects were quite common, and a reasonably accurate low cost meter was not available.

U.S. Pat. No. 3,764,909, mentioned previously discloses a meter which can be mass produced, provides the desired accuracy, and can be rapidly assembled. The meter disclosed herein, while incorporating some of the features of U.S. Pat. No. 3,764,909, includes many unique additional features which provide fo rapid and inexpensive assembly and manufacture, with a minimum of expensive tooling.

In accordance with this invention, inaccuracies which may result from an accumulation of tolerances are either compensated for, or are rendered insignificant as a result of the meter construction, while maintaining many advantages which permit rapid assembly and manufacture of a low cost meter.

OBJECTS OF THE INVENTION

Correspondingly, it is an object of this invention to provide a meter with a magnetic circuit having unique fixed locating surfaces which cooperate with a unique base having fixed locating surfaces which permit mounting and securing the magnetic circuit on the base in a predetermined position by the simple expedient of snap fitting or pressing the magnetic circuit into the base.

Another object of this invention is a meter with a unique base in the form of a frame which supports both the magnetic circuit of the meter as well as the suspension support elements for the moving coil of the meter.

Another object of the invention is a unique base of sheet metal construction which can be accurately formed to reduce to a minimum the effects of any accumulation of tolerances, this base having locating surfaces for precisely positioning the magnetic circuit on the base in a predetermined position with respect to the axis of rotation of the moving coil of the instrument, by the simple expedient of pressing the magnetic circuit into position on the base.

It is a further object of the invention to provide a unique base of bendable sheet metal which is sufficiently flexible that the magnetic circuit parts can be inserted by a simple press-into-position operation, and in which the base, when in its normal upright position, includes a bottom frame portion, integral supports at each end for supporting the suspension system of the moving coil, and sides for supporting and securing the magnetic circuit in a predetermined position on the bottom.

It is a further object to provide a unique base, magnetic circuit, and casing arrangement in which a sheet material base having some flexibility or resiliency supports and clamps the magnetic circuit in a predetermined position on the base, and in which the mounting of the assembled meter in its casing requires further slight compressing of the sides of the base to thereby increase the clamping pressure of the base on the magnetic circuit, and wherein this clamping pressure is maintained by the casing after the meter is secured to the casing.

It is a further object of the invention to provide a unique casing mounting arrangement for a meter movement in which the casing includes projections, accurately formed and extending into ears of a sheet material meter supporting base to precisely position the meter movement with respect to its casing, additional surfaces for supporting the meter movement and a scale plate mounted on the casing in a predetermined position with respect to the casing, so mounting the meter movement in the casing aligns the movement with the scale without the need for positional adjustments of the movement with respect to the casing.

It is a further object of the invention to provide a unique suspension arrangement for a taut band suspended moving coil instrument in which a pair of projections of a rear coil mounted terminal assembly cooperate with a hub to limit displacement of one end of the coil thereby preventing damage to one of the taut bands of the suspension in the event of shock and vibration, and in which a one piece sheet metal balance cross has integrally formed stop tabs which cooperate with an opposite hub to limit the displacement of the opposite end of the coil as a result of shock or vibration, thereby preventing damage to the taut band of the suspension for this opposite end of the coil in the event that the meter is dropped or subjected to similar shock.

An additional object of the invention is to provide a low cost meter movement, including several accurately formed sheet metal parts, in which cooperating locating tabs and recesses provide for quickly and accurately mounting and securing the parts together with a minimum of tooling, to provide a low cost easy to assemble and accurate meter.

Numerous other features, objects, and advantages of the meter of this invention will become apparent with reference to the accompanying drawings which form a part of this specification, and show a typical preferred embodiment of the meter.

A. THE METER

Figure 1:
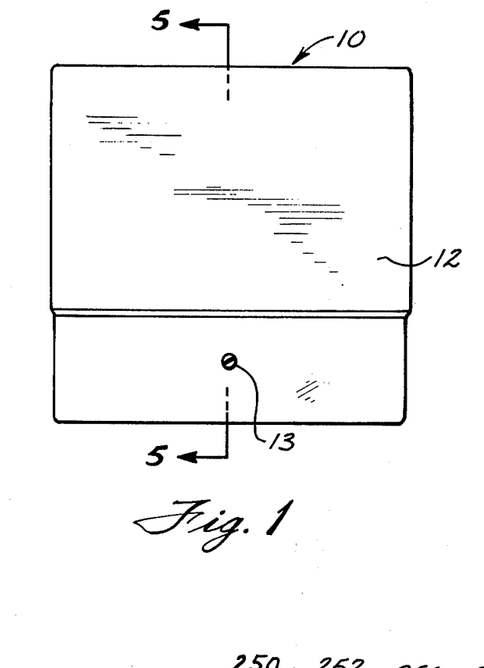
FIG. 1 is a front view in elevation a typical embodiment of the meter of this invention.
Figure 2:
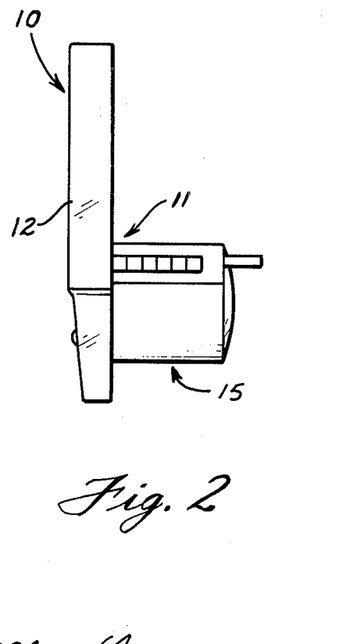
FIG. 2 is a side view of the meter of FIG. 1.
Figure 3:
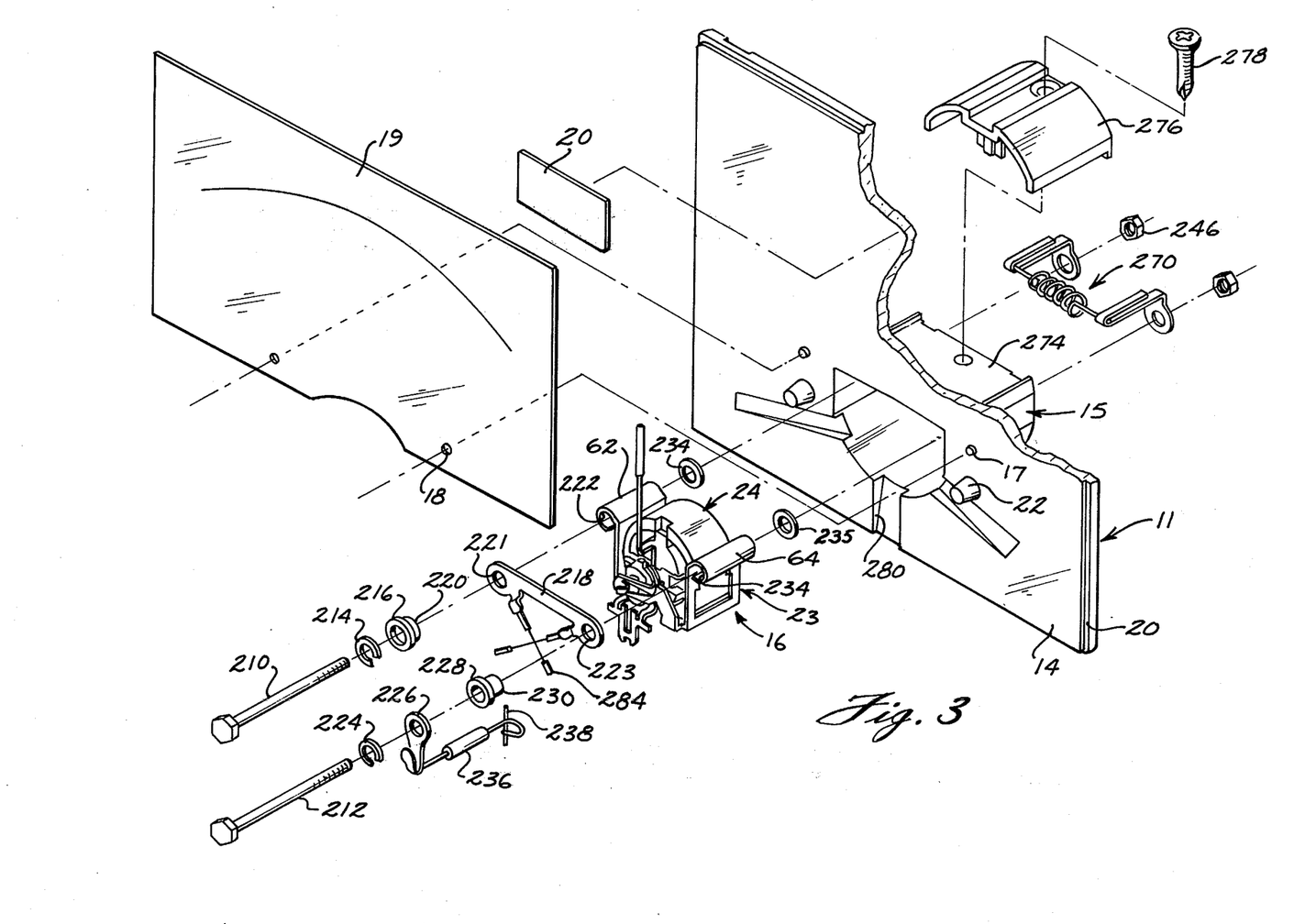
FIG. 3 is an exploded view in perspective of the meter and its casing.

Referring to the drawings, particularly FIGS. 1–3, a typical embodiment of the meter of this invention will now be described. Meter assembly 10 includes a casing 11 with a snap on transparent cover 12. A zero adjust knob 13 is mounted for rotation in cover 12. As shown at FIG. 3, casing 11 is of one piece molded construction, being formed from plastic material, and includes a generally rectangular face plate 14 and a rearwardly extending meter movement housing 15. Housing 15 provides for mounting a meter movement 16 (FIG. 3) in a precise predetermined position within the housing, as will later be described in detail.

A pair of locating pins 17 project outwardly from the front of face plate 14 and cooperate with openings 18 of a flat scale 19 to locate the scale in a precise predetermined position on casing 11. The scale 19 is secured to the front of the face plate by a strip of tape 20 having pressure sensitive adhesive on both of its surfaces.

Face plate 14 has a peripheral shoulder 20 which cooperates with a similar shoulder 21 (FIG. 5) on the interior of cover 12 so that the enclosure formed when cover 12 is snapped on the face plate is completely enclosed and essentially dust free. Cover 12 is formed from a transparent plastic material which has some flexibility. Stop pins 22 limit movement of cover 12 toward the meter movement, thereby preventing damage to the meter movement in the event that excessive pressure is accidentally applied to the from face of cover 12.

B. THE METER MOVEMENT AND ITS SUPPORTING BASE

Figure 4:
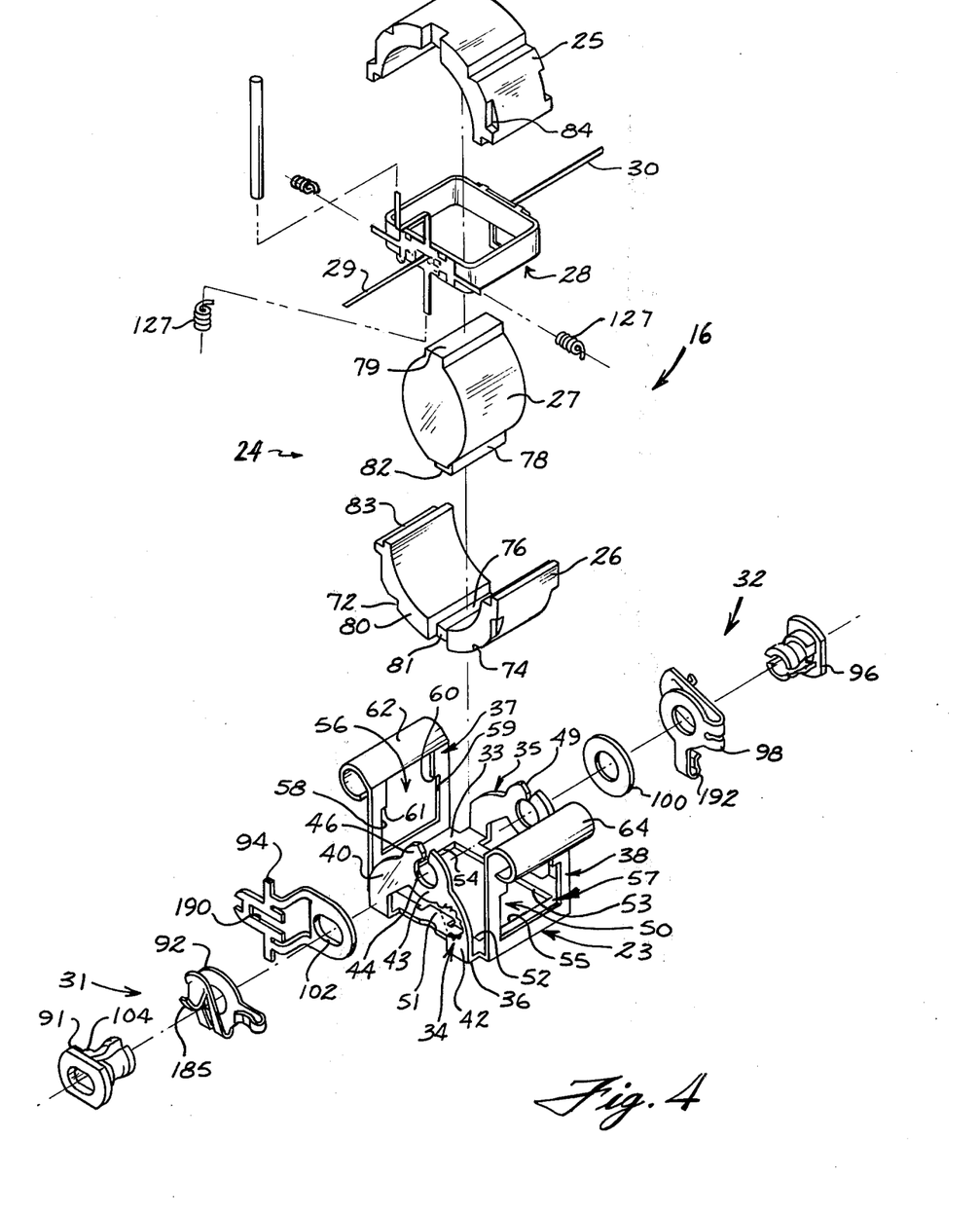
FIG. 4 is an exploded view in perspective of the meter movement of the meter.

As shown at FIGS. 3 and 4, meter movement 16 includes a base 23 which supports all the elements of the meter movement. Supported on base 23 is a magnetic circuit 24 including an upper yoke piece 25, a lower yoke piece 26 and a magnet 27. A coil assembly 28 has front and rear taut bands 29 and 30. Front taut band 29 is supported on base 23 by front support elements 31, and rear band 30 is supported on the base by rear support elements 32, to mount the coil for rotation on a predetermined axis.

As shown at FIG. 4, base 26 is a unitary or one piece supporting base which is advantageously formed from nonmagnetic sheet metal of essentially uniform thickness by stamping and bending. The base is of a frame like construction and includes a flat bottom or magnetic support portion 33 which, when the meter movement is in its upright position shown at FIG. 3, is generally horizontal. Projecting upwardly from each end of bottom 33, and parallel to each other are front and rear support structures 34 and 35 respectively, which are bent upwardly as at 36 from bottom 33.

Sides 37 and 38 project upwardly from bottom 33, are generally parallel to each other, and lie in respective planes perpendicular to the planes defined by front support structure 34 and rear support structure 35.

Front support structure 34 includes a pair of spaced apart arms 40 and 42 connected to a centrally located hub support 43. An opening 44 is defined by curved fingers 46 which terminate with their tips in spaced relation to each other at the upper vertical center of hub support 43. The rear support structure 35 is essentially identical to front support structure 30, and includes a hub support 49.

Bottom 33 takes the form fo a rectangular frame with a rectangular opening 50. Opening 50 has a front edge 52, a rear edge 53, and side edges 54 and 55. Projecting into this opening from the front of the bottom is a rectangular tongue 51. As will later be described in detail, these edges precisely locate lower yoke piece 26 and magnet 27 with respect to the base and the axis of rotation of coil 28.

Sides 37 and 38 have openings 56 and 57, respectively to receive and secure the magnetic circuit to base 23, openings 56 and 57 each have parallel side edges 58 and 59 and downwardly facing magnetic circuit retaining edges 60 and 61. At the upper ends of the sides are outwardly turned elongated mounting ears 62 and 64 which provide for mounting and securing the meter movement 16 in its casing.

C. THE MAGNETIC CIRCUIT AND ITS MOUNTING ON THE BASE

Yoke pieces 25 and 26 which are each semi-circular, can be of identical construction so that yoke piece 25 is merely yoke piece 26 inverted. Magnet 27 is clamped between the yoke pieces. Each yoke piece is formed of soft iron or some other non-retentive magnetic material, and magnet 27 is formed from a permanent magnet material.

Yoke piece 26 has a pair of parallel locating grooves 72 and 74 respectively which are equally spaced on opposite sides of the center of the yoke piece. Each yoke piece has a rectangular longitudinally extending internal magnet locating slot 76 to receive rectangular ends 78 and 79 of magnet 27. Front face 80 of the yoke element has a notch 81 which is aligned with a notch 82 at the front of end 78 of the magnet. The upper yoke piece seats on the lower yoke piece at a stepped surface 83 which enhances the continuity of the magnetic circuit. The magnetic circuit so far described, except for grooves 72 and 74, is more fully disclosed in U.S. Pat. No. 3,764,909 which is incorporated herein by reference. On the outside of upper yoke element 25 are notches 84 which open outwardly and toward the opposite ends of the yoke piece.

Figure 5:
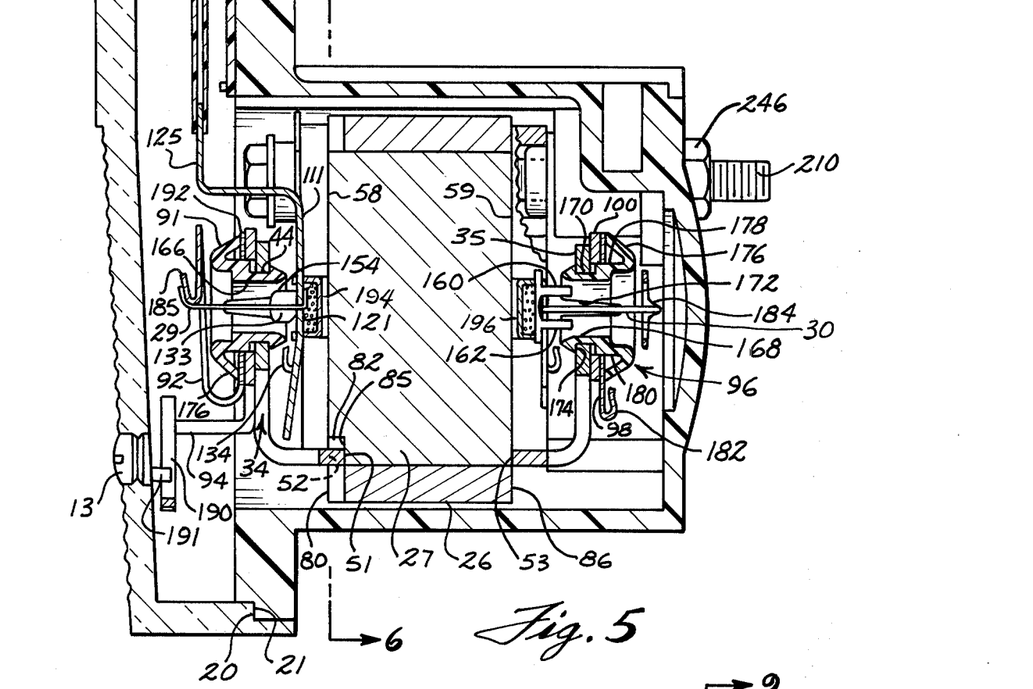
FIG. 5 is a partial view in section taken along line 5—5 of FIG. 1.

The various locating edges and locating surfaces of base 23 and the grooves, and notches of the yoke pieces and magnet precisely position the magnetic circuit with respect to the base. As shown at FIG. 5, lower yoke piece 26 and magnet 27 are oriented and located in a fore and aft direction on base 23 by rear edge 53, front edge 52, and locating tongue 51 of the base. Tongue 51 engages a flat surface 85 of notch 82 of the magnet to maintain the rear surface of the magnet against edge 53. Front edge 52 engages front face 80 of the lower yoke piece 26 and rear edge 53 engages rear face 86 of the yoke piece to precisely position the yoke piece fore and aft. In addition, side edges 58 and 59 of the sides 37 and 38 engage front face 80 and rear face 86 of both yoke pieces to provide precise fore and aft positioning.

Figure 6:
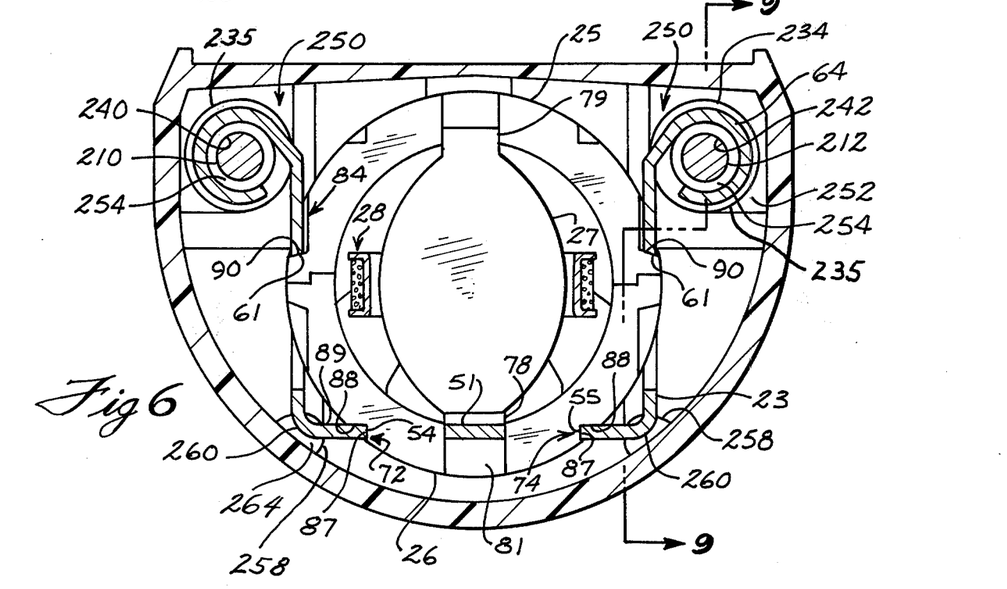
FIG. 6 is a view in section taken along line 6—6 of FIG. 5.

As shown at FIG. 6, precise angular orientation and vertical positioning of lower yoke piece 26 with respect to the base is attained by the cooperation of side edges 54 and 55 of the base with the grooves 72 and 74 of yoke piece 26. Each of grooves 72 and 74 is milled in the yoke piece 26 so that the faces 87 and 88 of each groove extend at a right angle to each other. Top surface 89 of the bottom of the base forms a precise right angle with edges 54 and 55 in the region of engagement of these edges with the groove 72 and 74. The horizontal faces 88 of groove 72 and 74 are coplaner, and the vertical faces 87 of the groove are each precisely parallel. The distance between these faces corresponds to the distance between edges 54 and 55 of the base. The edges 54 and 55 engage the face 87 along the entire length of yoke piece 26, and faces 88 engage the surface 89 along the entire length of the yoke piece. This arrangement provides for precisely locating the lower yoke piece both angularly and vertically with respect to the base.

Upper yoke piece 25 is also precisely formed so that upon seating the upper yoke piece on the lower yoke piece, as shown at FIG. 6, with the magnet between the yoke pieces, magnet 27 is clamped between the yoke pieces, and the upper yoke piece is precisely located vertically with respect to the base. The magnetic circuit is securely clamped to the base by the cooperation of retaining edges 60 and 61 of the base which engage in notches 84 of the upper yoke piece 26 to clamp upper yoke piece 25 tightly against the lower piece and the magnet.

As shown at FIG. 6, each notch 84 has a surface 90 which slopes downwardly and faces outwardly. Retaining edge 61 of base 23 slopes upwardly and faces inwardly. Correspondingly, when sides 37 and 38 are spread apart, the magnetic circuit is inserted, and the sides are then released and pressed inwardly, the locating edges 61 cam along surfaces 90 (at four locations) to clamp and retain the magnetic circuit securely on the base.

D. THE COIL ASSEMBLY AND ITS ANTI-SHOCK SUPPORT

The assembly of front support elements 31 includes a plastic material hub 91, a taut band support element 92, and a zero adjust element 94. The rear assembly of support elements includes a rear hub 96, a rear taut band support element 98 and a washer 100 of insulating material.

Front hub 91 is a snap fit in opening 44 of the front support structure of the base. The zero adjust element 94 and taut band support element 92 are mounted on the hub with the taut band support element between the zero adjust element and the enlarged head of the hub.

Zero adjust element 94 has an oblong opening 102 with parallel sides which receives the flat sided portion 104 of hub 91. This mating arrangement keys the hub to the zero adjust element so the hub rotates when zero adjust element 94 is rotated, and since support element 92 is clamped between the head of hub 91 and the zero adjust element 94, taut band support 92 rotates to change the at rest position of coil 28. The assembled position of hub 91, support element 92, and zero adjust element 94 is shown at FIG. 5.

Rear hub 96 snaps into the opening in rear support structure 35 to mount taut band support element 98. Insulating washer 100 cooperates with hub 96 to electrically insultate rear support element 98 from base 23.

Figure 7:
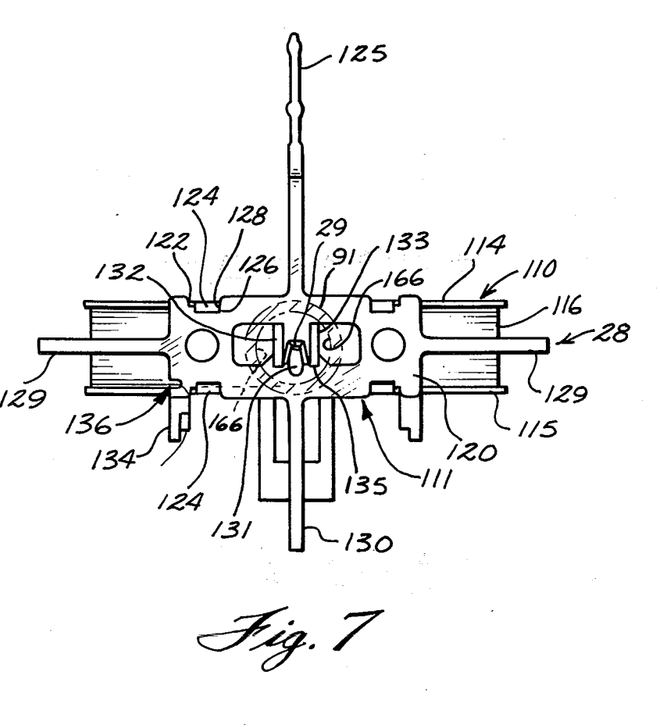
FIG. 7 is a front view of the coil assembly of the meter.
Figure 8:
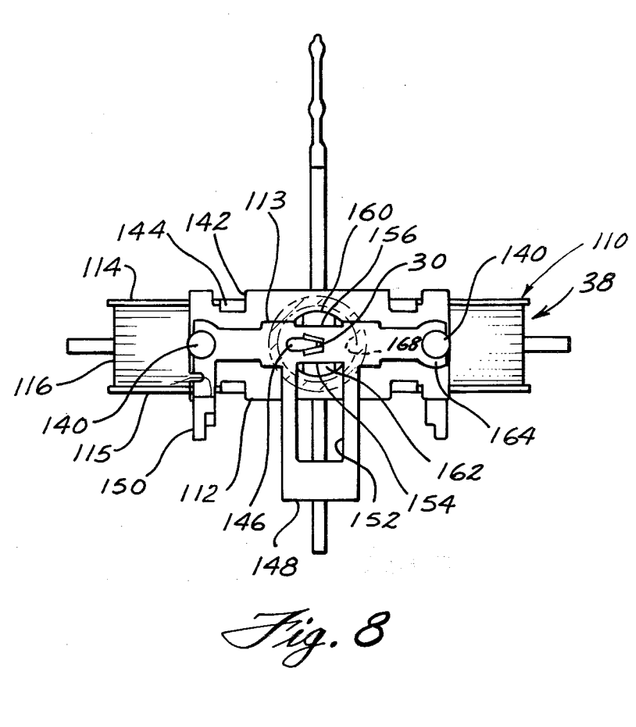
FIG. 8 is a rear view of the coil assembly of FIG. 7.

Coil assembly 28 is fabricated from only three sheet metal parts, a coil and an insulator. As shown at FIGS. 7 and 8 the coil assembly includes a metal bobbin or frame 110, a balance cross 111, an insulator 112 at the rear of the frame, and a rear terminal and taut band support 113. Frame 110 has an upper flange 114 and a lower flange 115 and a coil 116 is wound on the frame between the flanges.

Balance cross 111 is formed of sheet metal of uniform thickness. The balance cross has a flat body 120 with spaced apart recesses 122 at its upper and lower edges. These recesses correspond in position to tabs 124 integral with the flanges 114, 115 of the frame so the balance cross can be secured to the frame by positioning the balance cross with the tabs in the recesses and bending the tabs over toward each other to the position shown at FIG. 7. The dimension of the tabs and recesses is such that the balance cross is accurately positioned by the cooperation of side edges 126 of the tabs with side edges 128 of the recesses.

Extending horizontally from the sides of the body 120 of the balance cross are balance weight receiving arms 129, and projecting downwardly from the center of body 20 is a leg 130. Balance weights 127 (FIG. 4) are positioned on arms 129 and leg 130 during final assembly. A pointer mounting staff 125 extends upwardly from body 120 and is bent to extend forwardly and then upwardly, as shown at FIG. 5. Formed in the center of body 120 (FIG. 7) is an opening through which front taut band 29 extends. The opening 131 is generally v-shaped and has rounded edges. Taut band 29 extends through the opening and is welded to the surface of body 120 which faces toward coil 116, (FIG. 5).

Stop tabs 132 and 133 are bent forwardly from the material of body 120. The tabs 132, 133 are generally parallel to staff 125, are on opposite sides of taut band 29 and are each the same distance from the band. The outer corners 135 of the tabs are each the same distance from taut band 29.

As shown at FIG. 7, a terminal 134 is integral with body 120 of the balance cross. A wire 136 from one end of coil 116 is threaded through the terminal and is welded to the terminal to electrically and mechanically secure the wire to the balance cross. An electrical circuit to one side of the coil is thereby created from wire 136 to front taut band support element 92, via balance cross 110, and taut band 29.

Insulator 112 at the rear of coil assembly 28 is generally rectangular. The insulator has a pair of posts 140 which project rearwardly away from coil 116. Formed in the upper and lower edges of insulator 112 are notches 142. Projecting rearwardly from flanges 114 and 115 of the coil frame are securing tabs 144. The spacing between tabs 144 is the same as the horizontal spacing between notches 142 so insulator 112 can be secured to the coil frame by aligning notches 142 with the tabs and then bending the tabs over to the position shown at FIG. 8, without using expensive jigs or fixtures. The tabs and notches both align the insulator with respect to the coil frame and secure the insulator to the frame.

Taut band support plate 113 is a flat metal stamping. This one piece support plate includes an opening 146 fo rear taut band 30, which is secured to the side of the plate that faces toward insulator 112. The support plate includes a generally rectangular downwardly depending counter weight portion 148 which is a coarse counter weight to the pointer staff and pointer.

A terminal 150 at one side of the support plate is integral with rear support plate 113 and provides for connecting the coil to the support plate by welding.

A rectangular opening 152 in counter weight portion 148 presents a horizontal edge 154 below the taut band, and there is a horizontal edge 156 above the taut band in a shallow notch. Projecting outwardly from insulator 112 and integral with the insulator are stop ears 160 and 162 with outside surfaces that curve about the taut band 30. The distance between these ears is the same as the distance between edges 154 and 156, and the width of the ears equal respectively, the width of opening 152 and the width of the notch defining edge 156. The outer surfaces of ears 160 and 162 are symmetrical about taut band 30.

The mounting of support plate 113 on insulator 112 is accomplished by moving the insulator into position on ears 160 and 162 in a direction along the axis of taut band 30. The ends 164 of the support plate have circular recesses to permit simultaneously sliding the support plate over the cylindrical posts 140. After the support plate is positioned on the insulator, posts 140 are upset, as by sonic deforming, to secure the support plate to the insulator. Ears 160 and 162 and posts 140 cooperate with the locating surfaces of the support plate to precisely locate the plate in position on the insulator.

As shown at FIG. 5, front hub 91 and rear hub 96 snap into the respective openings in the front and rear support structures of base 23. To enhance the deformability of the hubs, the snap in portion 170 of each hub includes a slot 172, as shown for hub 96. A shoulder 174 engages the innersurface of the rear hub support 35 to retain the hub in position. The head of the hub has resilient wings 176 which bear against the taut band support element 98, and urge shoulder 174 against the hub support. The cylindrical ends 178 of the flat portion 104 of the hub engage the interior of an opening 180 through taut band support element 98 to precisely align the support element with the intended axis of rotation of the coil. The insulating washer 100 insulates rear taut band support element from the metal base 23. Rear taut band support element 98 has a terminal 182 to facilitate making external electrical connections, and a taut band support finger 184 to which taut band 30 is welded. The taut band support finger is resilient as shown for the finger 185 of front taut band support element 92. Finger 185 is formed on a portion of support element 92 which is bent around from the body portion to the position shown at FIGS. 4 and 5.

The zero adjust element 94 at the front support is bent forwardly and then downwardly to provide an opening between front legs 190 which cooperate with an eccentrically located pin 191 od zero adjust knob 13. The head of hub 91 is between the taut band support finger 185 and the body 192 of support element 92, and as shown at FIG. 5, wings 176 press the zero adjust element and the taut band support element resiliently against the front face of front support structure 134.

As shown at FIG. 5, tabs 132, 133 at the front of the coil assembly cooperate with front hub 91 and ears 160, 162 cooperate with rear hub 96 to limit the extent of transverse movement of the coil in the event the meter is subjected to shock or vibration. Tabs 132, 133 extend into bore 166 of hub 91 and are normally in spaced relation to the hub as shown at FIGS. 5 and 7. The corner edges 154 of the tabs have only a slight clearance with respect to bore 166 and correspondingly, the coil can move only a slight distance transversely before the tabs engage the surface of the bore. Similarly, ears 160 and 162 have only slight clearance with respect to bore 168 of rear hub 96 and limit the extent of transverse movement of the rear of the coil. This stop action of tabs 132, 133 and ears 160, 162 with the respective front and rear hubs prevents over stressing taut bands 29 and 30 in the event that the meter is subjected to shock or vibration.

Excessive movement of the coil assembly 28 along its axis is prevented by inside surfaces 194 and 196 of the coil frame 110 by engagement of these surfaces with the front and rear surfaces of magnet 27 in the event of impact along the axis of rotation of the coil. Within these limits of fore and aft movement of the coil, as provided by the predetermined clearance between the coil frame and the magnet, some elastic bending of taut band support arms 185 and 184 of the front and rear taut band support elements can occur and over stressing of the taut bands is thus avoided. By virtue of this arrangement, the taut bands are fully protected against breakage even though the meter is subjected to severe shock or vibration.

E. THE CASING AND SUPPORT FOR THE METER MOVEMENT

Figure 9:
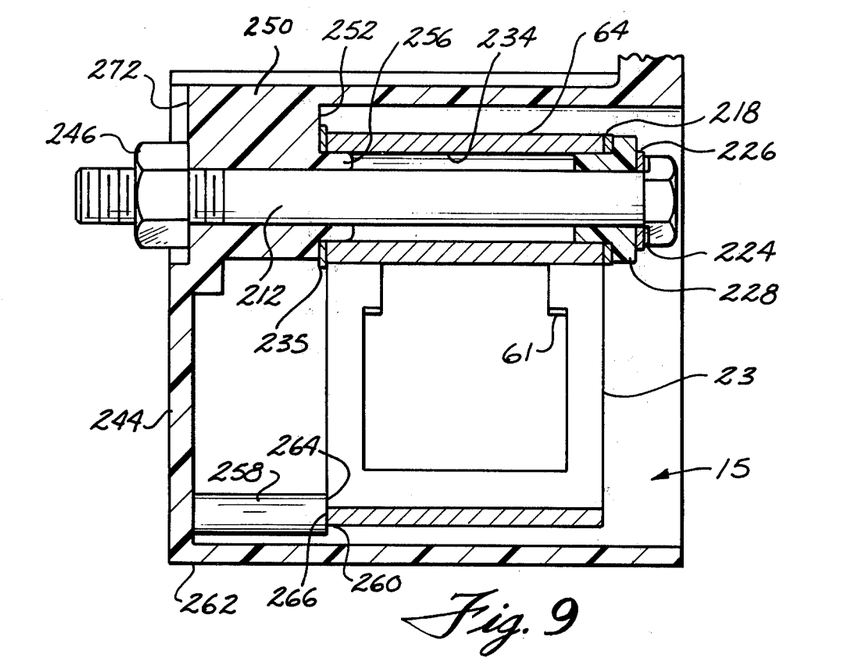
FIG. 9 is a view in section taken along line 9—9 of FIG. 6 with a magnetic circuit removed.

After meter movement 16 is assembled, the meter movement is mounted in housing 15 using the hardware and fittings shown at FIGS. 3 and 9. As shown, mounting bolts 210 and 212 extend respectively through ears 62 and 64 of the base. Bolt 210 which forms one external terminal of the assembled meter, extends through a lock washer 214, a metal centering bushing 216, and an opening 221 at one side of a metal cross piece 218. Bushing 216 has a smaller diameter end 220 which extends through the opening in cross piece 218 and into opening 222 of ear 62.

Bolt 212 (FIGS. 3 and 9) extend through lock washer 224, terminal connector 226, and an insulating material centering bushing 228. Bushing 228 has a cylindrical end 230 which extends through an opening 223 of cross piece 218 and into opening 234 or ear 64. At the rear of each ear is a thin bearing washer 235. A calibrating resistor 236 can be connected between connector 226 a flexible wire 238 which is connected to the terminal at rear taut band support element 98 before the meter movement is inserted in housing 15. Bolts 210 and 212 extend respectively through openings 240 and 242 (FIG. 6) in the rear wall 244 of the housing, and nuts 246 are threaded onto the bolts to secure the meter movement in the housing.

As shown at FIGS. 6 and 9, blocks 250 integral with the housing are located at the upper rear corners of the housing. These blocks each present a flat locating surface 252 which locates the meter movement in a fore and aft direction with respect to the housing. Washers 235 provide a bearing surface between the ends of the ears and surface 252.

Projecting forwardly from surface 252 are locating bosses 254, which are concentric with the respective openings 240 and 242 through which mounting bolts 210 and 212 extend. Locating bosses 254 extend into the rearward ends of ears 62 and 64 to maintain the distance between the ears at the precise predetermined distance, and to prevent spreading of the ears and sides of the base after the meter is secured in the housing.

The distance between the centers of bosses 254 is slightly less than the distance between the centers of ears 62 and 64 so that it is necessary to slightly squeeze the ears and the sides of the base toward each other, during insertion of the meter movement into the housing. This movement of the ears and sides of the base toward each other during assembly increases the force exerted on the magnetic circuit by the sloping edges 60 and 61 of the base on the sloping surfaces 90 of the upper yokepiece. Consequently, the magnetic circuit is tightly gripped by the base. Advantageously, the distance between openings 221 an 232 of cross piece 218 is the same as the center to center distance between bosses 254, so that ears 62 and 64 are also urged together at the front of base.

By virtue of this mounting arrangement, the meter movement is secured in position in the housing, with the sides of the base compressed to firmly grip the magnetic circuit, and the meter movement suspended from the mounting arrangement including bolts 210 and 212.

As is apparent with reference to FIG. 9, this mounting arrangement provides a cantilever type support for base 23. To resist downward pivoting movement of the base when the meter is in its upright position, generally arcuate abutment ribs 258 (FIGS. 5, 6 and 9) are provided in housing 15 to engage each rear corner 260 of the base. As shown at FIGS. 6 and 9, the abutments 258 are each integrally formed with the side wall of housing 15, extend to rear wall 244 of the housing, and terminate at a flat stop face 264 which engages the rear of base 23 at the surface 266 presented by rear corner 260.

The stop faces 264 of the respective ribs 258 are coplaner, and so located with respect to the housing that the surfaces 266 at the rear corners of the base seat tightly against these stop faces when screws 210 and 212 are tightened.

F. ASSEMBLY

A distinct advantage of the meter of this invention is the simplicity of its assembly, which can be accomplished without expensive jigs or fixtures, by virtue of the locating surfaces and edges on the various parts which precisely locate the parts at a predetermined position with respect to the axis of rotation of the coil assembly 28.

After base 23 is formed, the lower yoke piece 26, magnet 27, coil assembly 28, and upper yoke piece 25 are inserted in the base by simple downward movement of these parts. During such insertion, sides 37 and 38 of the base are spread apart slightly, within the elastic limit of the metal base, to permit these parts to be inserted. The sides are then released so that the magnetic circuit is clamped in position with the various locating and positioning edges of the base precisely locating the yoke pieces and magnet, and with the retaining edges, 60 and 61 of the base securing the magnetic circuit in position on the base. The tongue 51 of the base cooperates with the notches of the yoke pieces and magnet to permit assembly in one orientation only as is described in detailin U.S. Pat. No. 3,764,909.

The front and rear taut band support elements are supported and retained by the snap and hubs which can be snapped into position in the front and rear support structures of the base after the magnetic circuit is mounted on the base. With the front and rear support elements in position, taut bands 29 and 30 are threaded through the front and rear hubs and the taut bands are welded to the resilient support fingers of the respective front and rear support elements 92 and 98. By virtue of the positioning surfaces on hubs 91 and 96, taut band support elements 92 and 98 mount coil assembly 28 for rotation about a predetermined axis on the base, without the need for adjustment.

The inner ends of the taut bands 29 and 30 which are secured respectively to the balance cross 111 and rear terminal plate 113, have their axes precisely positioned by virtue of the mounting and securing arrangement previously described with reference to FIGS. 7 and 8. Correspondingly, the various parts of the meter movement are precisely positioned with respect to a predetermined axis of rotation of coil assembly 28 by virtue of the locating surfaces and edges of the unitary base.

The bosses 254 within housing 15 precisely position the meter movement with respect to the housing and face plate 14. In addition, scale 19 is precisely positioned with respect to the face plate. This arrangement provides for precise positioning of the meter movement with respect to scale 19 without requiring expensive assembly fixtures.

As is apparent, the electrical circuit from one side of the coil is to mounting bolt 210 via metal bridge 111, front taut band 29, front taut band support bands 92, the metal of base 23, and conductive centering bushing 216. On the other hand, bolt 212 is insulated from ear 64 of the base (FIG. 9) through which the bolt extends, by boss 254, and insulating bushing 228, which maintain the bolt in spaced insulated relation with respect to the ear and base. In addition, insulator 112 insulates rear support plate 113 from the coil frame, and insulating washer 100 insulates rear taut band support element 98 from the base. This arrangement enables completing an electrical circuit from the rear of the coil to taut band support element 98 via the rear taut band 30, and to connector 226 via wire 238 and calibrating resistor 236 (when this resistor is used). The electrical connection to bolt 212 is through the lock washer 224 which engages connector 226.

Where required, a shunt 270 (FIG. 3) can be connected across the terminal ends of bolts 210 and 212. The mounting of the shunt is facilitated by vertical slots 272 (FIG. 9) formed in the outer surface of rear wall 244 of housing 15 so that the shunt connectors are recessed. Where shunt 270 is used, the shunt terminals are formed in the manner shown at FIG. 3 so the shunt extends over the top wall 274 of the housing. This permits enclosing the shunt by securing a terminal adaptor 276 on the housing with a screw 278. The arrangement including terminal adaptor 276 provides the advantage that a shunt, or other circuitry such as a rectifier bridge, can be added to the basic meter and can be enclosed by the adaptor after the meter movement is completely assembled and installed in the housing.

Slots 280, formed in the front of face plate 14 permit adjusting the positions of balancing weights 127 on the balance cross after the meter movement is mounted in housing 15. A suitable tool for adjusting the balance weights can be inserted through slots 280.

Pointer 282 is placed on staff 125 during final assembly. Cross piece 218 supports pointer stops 284 which limit the extent of deflection of the pointer and coil assembly 28.

While a typical perferred embodiment of the meter of this invention has been shown and described in detail, it is apparent that numerous changes can be made without departing from the scope of this invention. For example, a jeweled bearing pivot can be used to mount coil assembly for rotation in lieu of the taut band suspension arrangement described. This and other changes are within the intended scope of this invention, as set forth herein, and defined in the appended claims.

What is claimed is:

1. An instrument comprising, a unitary non-magnetic sheet material base of generally U-shaped configuration and including a rigid support portion: first and second sides and first and second ends projecting in the same directon from the support portion; said sides and ends projecting generally vertically from the support portion to provide an upwardly opening base when the base is upright; means on said ends for supporting a moving coil rotor including an indicator assembly for pivotal movement about an axis; a magnetic circuit including a permanent magnet, and a magnetic material yoke having a curved exterior surface; said support portion including locating and support edges offset toward each side of te base; cooperating locating and support surfaces on said yoke engaging the support edges of the support portion, and clamping means on said sides of the base for clamping the yoke on said support portion and including retaining edge means on each of said sides engaging cooperating surface means of the yoke to urge said yoke against said locating and support edges.

2. An instrument according to claim 1 wherein said base is formed from sheet metal; said locating and support edges adjacent each side of the base are elongated edges which face toward each other, and said cooperating locating and support surfaces on said magnetic circuit include elongayed grooves: said edges seating in and engaging said grooves along a substantial length of the grooves to support the magnetic circuit.

3. An instrument according to claim 1 wherein said support portion of the base has a generally rectangular opening the side edges of which form said support edges; said sides of the base each have a generally rectangular opening therein: said magnetic circuit is generally circular, and portions of said magnetic circuit extend through said rectangular openings of the support portion and sides; edges of said openings precisely locating said magnetic circuit, and means for orienting said magnetic circuit.

4. An instrument according to claim 1 wherein said retaining edge means on the sides of the base include a pair of inwardly sloping edges on each side, said cooperating surface means of the magnetic circuit include a pair of outwardly sloping surfaces on each side of the magnetic circuit; said edges engaging said surfaces to cam the magnetic circuit against the locating and support edges of the base in response to movement of the sides toward each other.

5. An instrument according to claim 1 wherein said base is a sheet metal base with sides sufficiently elastic to permit expanding same so that the magnetic circuit can be positioned on the base, and can be compressed to engage and clamp the magnetic circuit in position on the base, without exceeding the elastic limit of the metal of the base.

6. An instrument comprising, a unitary non-magnetic sheet material base of generally U-shaped configuration and including a rigid support portion: sides and ends projecting in the same direction from the support portion; said sides and ends projecting generally vertically from the support portion when the base is upright; means on said ends for supporting a rotor including an indicator assembly for pivotal movement about an axis; a magnetic circuit including a magnet, and a yoke having a curved exterior surface; said support portion including locating and support edges offset toward each side of the base; cooperating locating and support surfaces on said magnetic circuit engaging the support edges of the suppot portion, and clamping means on said sides of the base for clamping the magnetic circuit on said support portion and including retaining edge means on each of said sides engaging cooperating surface means of the magnetic circuit to urge said magnetic circuit against said locating and support edges, and means for mounting the base in a casing and comprising arcuately formed upper portions of the respective sides adapted to receive fasteners for securing the instrument to a casing.

7. An instrument according to claim 1 wherein said ends each have an opening along the axis of movement of the indicator; and said means supporting the indicator assembly comprises, snap in support means adapted to be snapped through said openings for supporting the indicator assembly and for locating the axis of movement of the indicator assembly at a predetermined positon with respect to the magnetic circuit.

8. A moving element meter comprising, a unitary sheet material base with a rigid support portion; sides, and ends projection in the same direction from the support portion; the support portion including fixed locating means cooperatingwith fixed surfaces of a magnetic circuit to position the magnetic circuit with respect to the base; retaining means on the sides of the base engaging surfaces of the magnetic circuit to urge the magnetic circuit toward the base; mounting ears at the upper portions of each side and having parallel openings; a housing; bosses in said housing and extending into said ears to position the meter in the housing and to retain the sides against movement with respect to each other; and means for securing the base with respect to the housing.

9. A meter according to claim 8 wherein the retaining means of the base includes cam surface means facing toward the support portion for increasing clamping pressure on the magnetic circuit in response to movement of the sides toward each other; said bosses of the housing having a spacing less than the distance between the mounting ears so that the bosses maintain the sides compressed and the magnetic circuit tightly clamped in the base.

10. A meter according to claim 8 wherein said bosses include fastener receiving means; elongated fasteners extend through said ears and into the fastener receiving means; and a cross piece extends between the fasteners at ends of the ears opposite the bosses.

11. A meter assembly according to claim 10 wherein, centering means on the fasteners space the fasteners with respect to surfaces of the ears; and said fasteners and ears are maintained parallel by the bosses, centering means, and cross piece.

12. A meter assembly according to claim 8 wherein, said sides each have a rear surface; and abutments of the housing engage the rear surface of the sides, adjacent a lower portion of each side to stabilize the base.

13. A meter according to claim 12 wherein stop surfaces, adjacent said bosses, locate the base in the fore and aft direction in the housing.

14. An indicating instrument comprising , in combination, a support a moving coil assembly taut band means supporting each end of the coil assembly for pivotal movement about a predetermined axis with respect to the support; a unitary pointer support of sheet metal of uniform thickness, the pointer support including an integral body portion and balance weight receiving arms integral with and projecting from the body portion; means for securing the pointer support to one end of the coil assembly; said pointer support further including taut band support means integral with said body portion of the pointer support, the taut band means supporting said one end of the coil assembly extending across said taut band support means and being connected to said body portion of the pointer support; and means for minimizing damage to the tatut band means supporting said one end of the coil assembly by limiting transverse movement of the coil assembly with respect to the support and comprising, a hub of electrical insulating material carried by the support and presenting surface means generally concentrically arranged with respect to the axis of rotation of the coil assembly, and stop means integral with and projecting from the pointer support, said stop means including surface means concentrically arranged with respect to the coil axis and in opposed relation to the surface means of the hub, said surface means of the stop means being normally slightly spaced from the surface means for the hub to permit pivoting of the coil assembly with respect to the support, and engaging the hub to resist damage to the taut band means in the event that the instrument is subjected to shock and vibration which causes transverse displacement of the coil assembly.

15. An indicating instrument according to claim 14 wherein, the instrument further includes, an insulator secured to a second end of said coil assembly; and means for limiting transverse displacement of the second end of the coil assembly and comprising, a hub carried by the support and presenting surface means generally concentrically arranged with respect to the pivotal axis of the coil assembly, and stop means integral with and projecting from the insulator, said stop means includng surface means concentrically arranged with respect to the pivotal axis of the of the coil assembly and in opposed relation to the surface means of the hub, said surface means of the insulator stop means being normally spaced from the surface means of the hub, to permit pivoting of the coil assembly with respect to the support, and engaging the hub to resist damage to the taut band means in the event that the instrument is subjected to shock and vibration which causes transverse displacement of the coil assembly.

16. An indicating instrument according to claim 14 wherein said coil assembly includes a sheet metal frame, and said means securing the pointer support to the coil assembly comprises, cooperating tab and recess means on said frame and said pointer support for accurately positioning the pointer support with respect to the frame, said tab means being bendable to secure the point support to the frame.

17. An indicating instrument according to claim 14 wherein said coil assembly includes a sheet metal frame; a terminal assembly comprises an insulator, and means securing said insulator to a terminal plate; cooperating tab and recess means on said frame and insulator for accurately locating said termminal assembly with respect to the coil assembly, said tab means being bendable to secure the terminal assembly to a second end of the coil.

18. An indicating instrument according to claim 17 wherein said terminal plates includes a downwardly projecting generally rectangular portion defining a coarse counterweight, said rectangular portion having an opening, and a portion of said insulator projecting through said opening.

19. An indicating instrument according to claim 14 wherein, said stop means integral with the pointer support includes, a pair of tabs on opposite sides respectively of the pivotal axis of the coil and having edges presenting said surface means of the stop means; and the surface of the hub include an inside surface of generally cylindrical curvture; said tabs extending into the hub.

20. An indicating instrument according to claim 15 wherein said stop means of said insulator includes a pair of ears presenting surfaces of arcuate curvature; and said surface means of said hub include arcuately curved inside surfaces of the hub; said ears extending into the hub.

21. An indicating instrument comprising, a support having sides and ends integral with and projecting in the same direction from base portion means, said base portion means supporting said sides for flexing movement with respect to the base portion without moving said ends; a magnetic circuit including a yoke and a magnet; cooperating locating and securing means on said magnetic circuit and base for positioning and securing said magnetic circuit on the base by flexing said sides; a moving coil assembly; taut band suspenssion means mounting said coil assembly on said ends of said support for rotation about a predetermined axis with respect to the support; a pointer support; cooperating fixed surface means on said pointer support and coil assembly for accurately locating the pointer support with respect to one end of the coil assembly; means integral with one of the coil assembly and pointer support for clamping the pointer support to the coil assembly to secure the pointer support to the coil assembly; a terminal at a second end of the coil assembly; cooperating fixed surface means for locating a terminal assembly with respect to the coil; and stop means on said pointer support and said terminal assembly presenting surfaces cooperating with surfaces carried by said ends of said support to limit transverse movement of the coil assembly caused by shock and vibration, so that damage to the taut band suspension of the instrument is minimized.

22. An indicting instrument according to claim 21 wherein said pointer support is a balance cross, said balance cross having arms projecting therefrom; and balance weights secured to said arms.

23. An indicating instrument according to claim 21 wherein said stop means on the pointer support includes a pair of tabs; one of said cooperating surfaces carried by one of said ends includes the inside surface of a hollow hub; and said tabs extend into the hub.

24. An indicating instrument according to claim 21 wherein said stop means on the terminal assembly includes a pair of ears, one of said cooperating surfaces carried by one of said ends includes the inside surface of a hollow hub, and said ears project into the hub.

* * * * *

UNITED STATES PATENT OFFICE
CERTIFICATE OF CORRECTION

Patent No. 4,024,472          Dated   May 17, 1977

Inventor(s)  Julius Nador and David B. Pearson

It is certified that error appears in the above-identified patent and that said Letters Patent are hereby corrected as shown below:

Column 1, line 50, after "provide" delete "fo" and substitute therefor -- for --.

Column 4, line 24, after "form" delete "fo" and substitute therefor -- of --.

Column 7, line 11, before "rear" delete "fo" and substitute therefor -- for --.

Column 8, line 1, after "191" delete "od" and substitute therefor -- of --.

Column 8, line 59, after "234" delete "or" and substitute therefor -- of --.

UNITED STATES PATENT OFFICE
CERTIFICATE OF CORRECTION

Patent No. 4,024,472         Dated May 17, 1977

Inventor(s) Julius Nador and David B. Pearson

It is certified that error appears in the above-identified patent and that said Letters Patent are hereby corrected as shown below:

IN THE CLAIMS:

Column 11, line 38 after "of" delete "te" and insert therefor -- the --.

Column 11, line 51, after "include" delete "elongayed" and substitute therefor -- elongated --.

Column 14, line 29, after "surface" insert -- means --.

Column 14, line 30, after "cylindrical" delete "curvture" and insert therefor -- curvature --.

Column 14, line 67 after "An" delete "indicting" and insert therefor -- indicating --.

Signed and Sealed this

Ninth Day of May 1978

[SEAL]

Attest:

RUTH C. MASON
Attesting Officer

LUTRELLE F. PARKER
Acting Commissioner of Patents and Trademarks